US010670023B2

(12) United States Patent
Roisum

(10) Patent No.: US 10,670,023 B2
(45) Date of Patent: Jun. 2, 2020

(54) METHODS, DEVICES, AND SYSTEMS FOR CONTROLLING A VALVE

(71) Applicant: Schwing America, Inc., Saint Paul, MN (US)

(72) Inventor: Scott Roisum, Pine City, MN (US)

(73) Assignee: SCHWING AMERICA, INC., St. Paul, MN (US)

( * ) Notice: Subject to any disclaimer, the term of this patent is extended or adjusted under 35 U.S.C. 154(b) by 166 days.

(21) Appl. No.: 15/653,850

(22) Filed: Jul. 19, 2017

(65) Prior Publication Data

US 2018/0023575 A1 Jan. 25, 2018

Related U.S. Application Data

(60) Provisional application No. 62/365,656, filed on Jul. 22, 2016.

(51) Int. Cl.
*F04D 15/00* (2006.01)
*G05B 19/05* (2006.01)
(Continued)

(52) U.S. Cl.
CPC .......... *F04D 15/0083* (2013.01); *F04B 15/02* (2013.01); *F04B 17/06* (2013.01); *F04B 49/02* (2013.01); *F04B 49/065* (2013.01); *F04B 49/22* (2013.01); *F04D 7/04* (2013.01); *F04D 15/0022* (2013.01); *F04D 15/0272* (2013.01); *G05B 19/058* (2013.01); *G05D 7/067* (2013.01); *F04B 2201/0606* (2013.01); *G05B 19/042* (2013.01); *H01L 21/67126* (2013.01); *H01L 21/67259* (2013.01)

(58) Field of Classification Search
CPC .... F04D 15/0083; F04D 7/04; F04D 15/0022; F04D 15/0272; F04B 49/22; F04B 17/06; F04B 49/02; F04B 15/02; F04B 49/065; F04B 2201/0606; G05D 7/067; G05B 19/058; G05B 19/042; H01L 21/67126; H01L 21/67259
USPC .................................................. 700/282–292
See application file for complete search history.

(56) References Cited

U.S. PATENT DOCUMENTS 6,681,815 B1 * 1/2004 Westrich ............. B67D 7/3218
141/198
6,705,079 B1 * 3/2004 Tabor ..................... E02F 9/2207
60/469

(Continued)

FOREIGN PATENT DOCUMENTS

WO WO2013040767 A1 3/2013

OTHER PUBLICATIONS

"Con Forms: Leading the Way in Concrete Pumping Systems," Construction Forms, Inc., Catalog, Rev 14, 2014, 56 pages.
(Continued)

*Primary Examiner* — Ziaul Karim
(74) *Attorney, Agent, or Firm* — Faegre Drinker Biddle & Reath LLP

(57) ABSTRACT

A method for use with a pumping system includes receiving a pump command signal for starting a pump; initiating a valve command signal for opening a valve, in response to the receiving the pump command signal; receiving a valve sensor signal indicating that the valve is open; and initiating a pump start command signal, in response to the received valve sensor signal.

17 Claims, 5 Drawing Sheets

(51) Int. Cl.

| | |
|---|---|
| *G05D 7/06* | (2006.01) |
| *F04D 7/04* | (2006.01) |
| *F04B 49/06* | (2006.01) |
| *F04D 15/02* | (2006.01) |
| *F04B 49/02* | (2006.01) |
| *F04B 49/22* | (2006.01) |
| *F04B 15/02* | (2006.01) |
| *F04B 17/06* | (2006.01) |
| *H01L 21/67* | (2006.01) |
| *G05B 19/042* | (2006.01) |

(56) References Cited

U.S. PATENT DOCUMENTS

| | | | |
|---|---|---|---|
| 6,786,233 B1* | 9/2004 | Anderson | B66C 23/64 |
| | | | 137/615 |
| 6,871,832 B2 | 3/2005 | Lehnhardt et al. | |
| 8,403,649 B2 | 3/2013 | Sanger et al. | |
| 2002/0043487 A1* | 4/2002 | Schick | B01D 61/145 |
| | | | 210/85 |
| 2004/0074558 A1 | 4/2004 | Preisser et al. | |
| 2007/0130927 A1* | 6/2007 | Pfaff | E02F 9/2207 |
| | | | 60/327 |
| 2009/0314354 A1* | 12/2009 | Chaffee | G05D 16/208 |
| | | | 137/14 |
| 2010/0126604 A1* | 5/2010 | Lund | F24D 17/0078 |
| | | | 137/565.01 |
| 2011/0190694 A1* | 8/2011 | Lanier, Jr. | A61M 5/14216 |
| | | | 604/67 |
| 2013/0336814 A1* | 12/2013 | Kamen | A61M 5/16859 |
| | | | 417/282 |
| 2016/0084274 A1* | 3/2016 | Afshari | F15B 7/006 |
| | | | 60/459 |
| 2018/0252213 A1* | 9/2018 | Afshari | F04C 11/00 |

OTHER PUBLICATIONS

"Knife Gate Valves and Check Valves," C.M.O., Catalog, Available at least as early as Jul. 23, 2010, 32 pages.

* cited by examiner

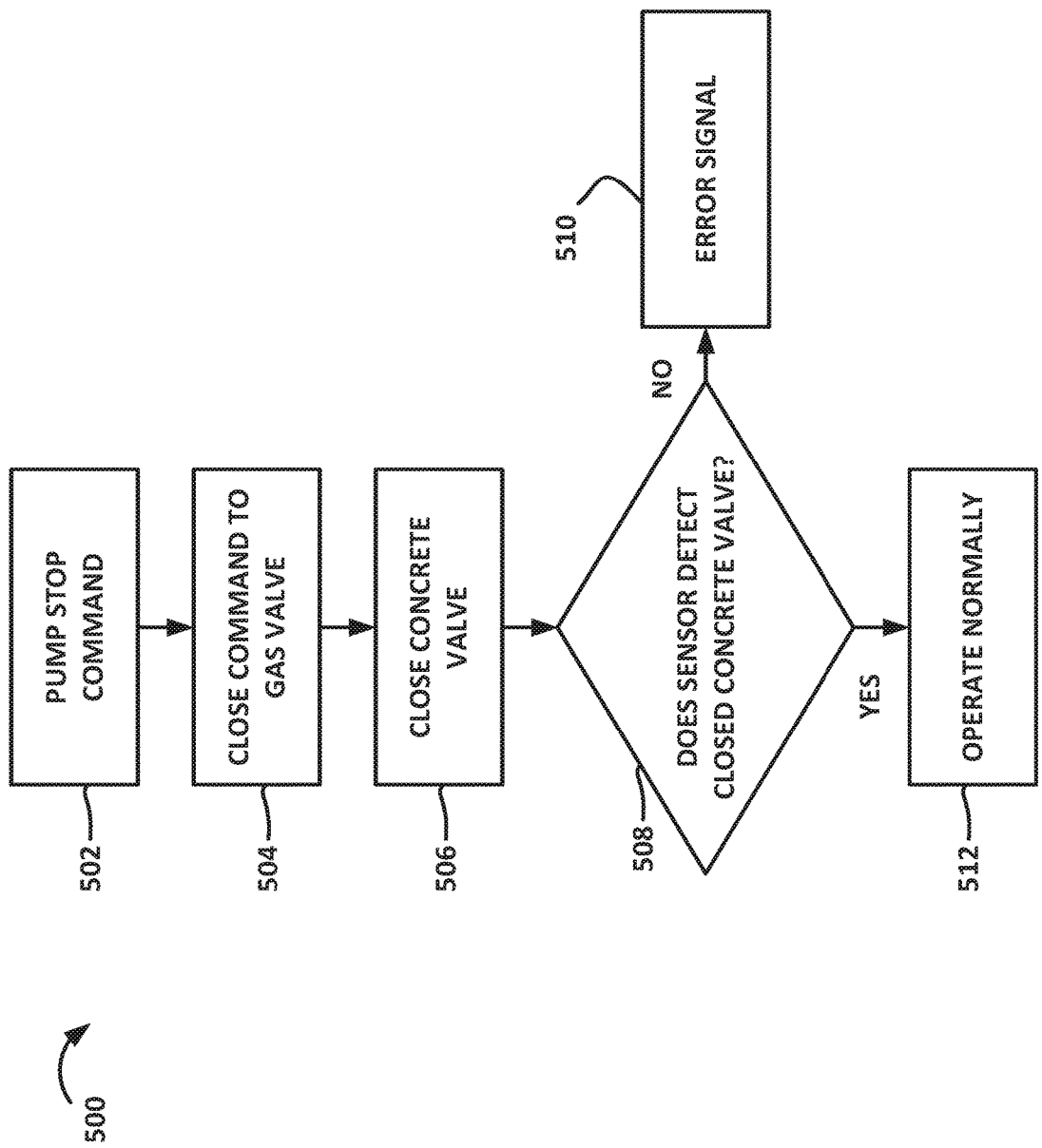

METHODS, DEVICES, AND SYSTEMS FOR CONTROLLING A VALVE

CROSS-REFERENCE TO RELATED APPLICATIONS

This application claims priority to U.S. Provisional Patent Application Ser. No. 62/365,656, filed Jul. 22, 2016, the disclosure of which is hereby expressly incorporated by reference in its entirety.

SUMMARY

In Example 1, a method for use with a pumping system, the method including receiving a pump command signal for starting a pump; initiating a valve command signal for opening a valve, in response to the receiving the pump command signal; receiving a valve sensor signal indicating that the valve is open; and initiating a pump start command signal, in response to the received valve sensor signal.

In Example 2, the method of Example 1, wherein the initiating the pump start command signal is performed in response to both the pump command signal and the valve sensor signal.

In Example 3, the method of any of Examples 1-2, wherein the pump command signal is configured to initiate a pump forward pumping operation.

In Example 4, the method of any of Examples 1-3, wherein the pump command signal is configured to initiate a pump reverse pumping operation.

In Example 5, the method of any of Examples 1-4, wherein a sensor is coupled to the valve, and wherein the sensor is configured to generate the sensor signal indicating that the valve is open.

In Example 6, the method of any of Examples 1-5, further including opening the valve, in response to the valve command signal; and powering the pump, in response to the pump start command signal.

In Example 7, the method of any of Examples 1-6, further including pumping a material, via the powered pump, through the valve.

In Example 8, the method of any of Examples 1-7, wherein the valve is a hydraulic valve and wherein the valve is coupled to a gas valve, the method further including regulating flow of gas between the gas valve and the valve, in response to the valve command signal.

In Example 9, a pumping system including control circuitry configured to: receive a pump command signal for starting a pump; initiate a valve command signal for opening a valve, in response to the pump command signal; receive a valve sensor signal indicating that the valve is open; and initiate a pump start command signal for starting the pump, in response to the received valve sensor signal.

In Example 10, the pumping system of Example 9, wherein the control circuitry is further configured to initiate the pump start command signal in response to both the valve sensor signal and the pump command signal.

In Example 11, the pumping system of any of Examples 9-10, further including the pump fluidly coupled to the valve.

In Example 12, the pumping system of any of Examples 9-11, the pumping system of paragraph 11, further including a sensor configured to generate the valve sensor signal, wherein the sensor is coupled to the valve.

In Example 13, the pumping system of any of Examples 9-12, wherein the valve includes an actuator, the pumping system further comprising: a gas valve coupled to the actuator and configured to actuate the valve into either an open or closed position.

In Example 14, a boom truck including a frame; a boom system coupled to the frame, wherein the boom system includes a plurality of boom sections; a material pumping system coupled to the frame; and a valve control system including circuitry. The material pumping system includes: a pump, a plurality of pipes, each pipe coupled to at least one of the plurality of boom sections and each pipe coupled to at least one other pipe to form a pumping conduit, a shut-off valve coupled to the pumping conduit, and a sensor coupled to the shut-off valve. The circuitry is configured to: receive a pump command signal for starting the pump, initiate a valve command signal for opening the shut-off valve, in response to the pump command signal, receive, from the sensor, a valve sensor signal indicating that the shut-off valve is open, and initiate a pump start command signal for starting the pump, in response to the received valve sensor signal.

In Example 15, the boom truck of Example 14, wherein the material pumping system further includes a gas valve fluidly coupled to an actuator for the shut-off valve.

In Example 16, the boom truck of any of Examples 14-15, wherein the shut-off valve is either a knife valve or a clamp valve.

In Example 17, the boom truck of any of Examples 14-16, wherein the sensor is a position sensor.

In Example 18, the boom truck of any of Examples 14-17, wherein the material pumping system further includes a hose fluidly coupled to the plurality of pipes.

While multiple embodiments are disclosed, still other embodiments of the present disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

FIG. 5 graphically represents various steps of a routine, in accordance with certain embodiments of the present disclosure.

Figure 1:
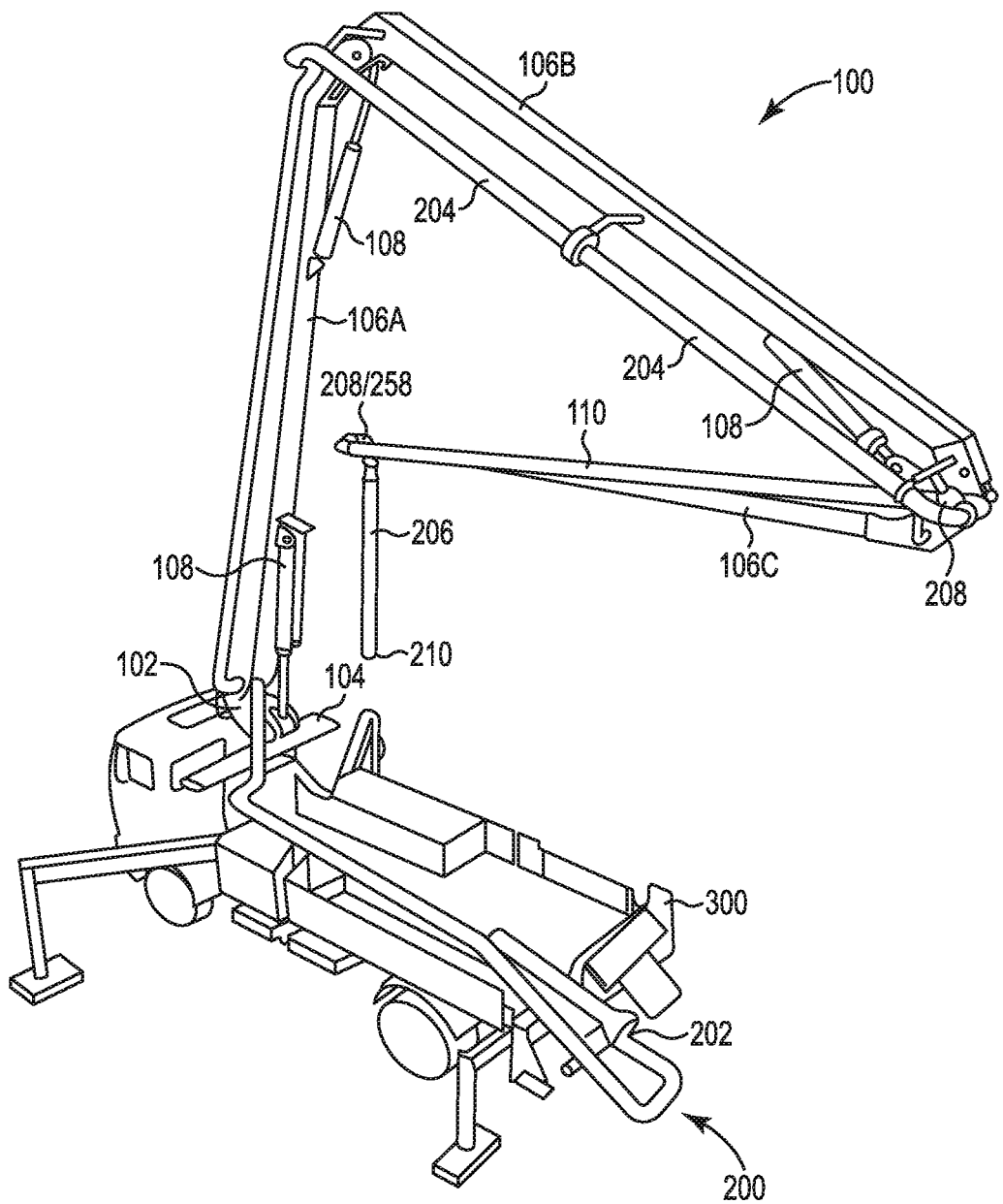
FIG. 1 shows a perspective view of a boom truck, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Certain embodiments of the present disclosure are directed to pumping systems, and more particularly, valve control systems useful in pumping systems. Pumping systems can be coupled to boom systems, such as truck-mounted boom systems, to facilitate pumping of liquid and/or semi-liquid materials (e.g., concrete, slurries, grout, waste). For example, boom systems can be used to support various components of pumping systems such as piping used to direct materials being pumped by a pump.

FIG. 1 illustrates a perspective view of various components of a boom system 100 and a pumping system 200 mounted on a truck 300, although it is contemplated that other mounting structures are within the scope of the present disclosure and that the boom system 100 and the pumping system 200 need not be mounted on an underlying structure.

The boom system 100 includes a boom support (or turret) 102, a base 104, a base boom section 106A, a middle boom section 106B, an end boom section 106C, and actuator assemblies 108 coupled between the boom sections 106A-C to facilitate relative movement between the boom sections 106A-C. The turret 102 is rotatably coupled to the base 104, which is mounted onto the truck 300 to support the boom sections 106A-C. The boom system 100 is hydraulically actuated, and the actuator assemblies 108 are hydraulic piston and cylinder assemblies, although other types of actuation systems (e.g., pneumatic, electrical) are contemplated and within the scope of the present disclosure. The boom system 100 is controlled by an operator, who directs the end boom section 106C such that a distal end 110 of the end boom section 106C moves to a desired position.

The pumping system 200 includes a pump 202, multiple sections of pipes 204 (collectively referred to as "piping"), a hose 206, and a valve 208. The pump 202 is fluidly coupled to the multiple sections of pipe 204, which form a conduit for pumping materials, and the hose 206. Each section of pipe 204 is coupled to either the truck 300 or one of the boom sections 106A-C. The pump 202 can be a centrifugal pump, piston-based pump, etc., and is configured to facilitate moving material. For example, when operating in a pump-forward state, the pump 202 pressurizes material such that the material flows through the piping 204 and exits the pumping system 200 through the hose 206 at a distal end 210 of the hose 206. When operating in a pump-reverse state, the pump 202 creates a vacuum such that material is sucked into the hose 206 and through the piping 204. The pump-forward state is used to deliver material to a desired working area, while the pump-reverse state is used typically to remove material from the piping 204 to clean the piping 204. An operator can articulate the end boom section 106C while another operator handles the hose 206 and moves the hose 206 to a desired location for adding or removing material (e.g., concrete).

Figure 2:
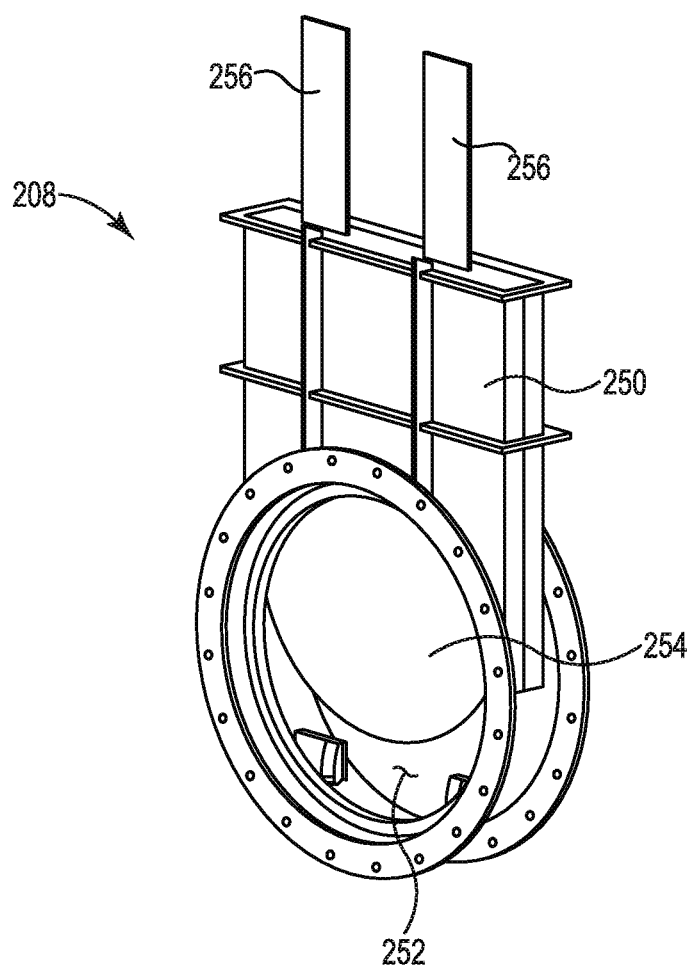
FIG. 2 shows a perspective view of a valve, in accordance with certain embodiments of the present disclosure.

The valve 208 can be one of a variety of types of shut-off valves such as a clamp valve or knife valve—which is shown in more detail in FIG. 2. The valve 208 is coupled to the piping 204 and configured to control flow of material through the piping 204. In some embodiments, the valve 208 is positioned between an input to the piping 204 and the distal end 210 of the hose 206. In some embodiments, the valve 208 is positioned between an exit of one of the sections of pipe 204 and an input to the hose 206. In some embodiments, the valve 208 is positioned external to and over a portion of the hose 206.

The valve 208 controls flow of material within the pumping system 200, for example, by moving between open and closed positions. For example, the valve 208 can be actuated to a closed position (e.g., to restrict flow) after the pump 202 is powered off to prevent material in the piping 204 from continuing to exit the hose 206 which could result in too much or unwanted material dripping into the work space. The valve 208 can be opened to permit flow of material through the piping 208.

The valve 208 shown in FIG. 2 is a knife valve. The valve 208 includes a housing 250 that forms an aperture 252 through which material is able to flow through when the valve 208 is in an open position. In FIG. 2, the valve 208 is shown as being partially open in that a portion of the aperture 252 is blocked by a blade 254. The blade 254 is coupled to at least one actuator 256, which moves the blade 254 within a slot of the housing 250 to block the aperture 252 (e.g., closed valve position) or moves the blade to open the aperture 252 (e.g., open valve position). The blade 254 is able to "cut through" materials (e.g., concrete) upon closing and restrict flow of the material. In certain embodiments, the actuator 256 is a hydraulic actuator but it is appreciated that other types of actuators (e.g., pneumatic, electrical) can be used with the valve 208 and are within the scope of the present disclosure. If hydraulically actuated, the actuator 256 can be coupled to a gas valve 258, which controls flow of air to the actuator 256 to open or close the valve 208. The gas valve 258 can be positioned in proximity to the valve 208 such that the gas valve 258 can quickly respond to commands to actuate the actuator 256 to open and close the valve 208. A sensor (discussed in more detail with respect to FIG. 3) can be coupled to the valve 208 and used to determine whether the valve 208 is in an open position or closed position. The sensor can be various position and/or proximity sensors, including optical, ultrasonic, and impedance sensors and the like.

The valve 208 can be controlled by an operator via a central control system, which can include dedicated controls for various systems such as the boom system 100 and pumping system 200 (including a valve control system discussed in more detail below). For example, an operator may utilize a valve control system within a central control system to open or close the valve 208, as opposed to the operator physically opening and closing the valve 208. An operator may also utilize a central control system to start the pump 202, move the actuator assemblies 108, etc. As such, an operator can control components of multiple systems at one central, remote location. The central control system may include a graphical user interface (e.g. a display screen) or a physical control center with buttons, knobs, etc., or a hybrid of such. The central control system may be wired or wireless and may be coupled to a truck.

When operating the boom system 100 and the pumping system 200, the operator may open the valve 208 before starting the pump 202 to permit flow of material through the pumping system 200. Conversely, the operator may close the valve 208 upon stopping the pump 202 to prevent material from continuing to exit the pumping system 200. However, if the valve 208 is remotely controlled, the operator may not be able to see whether the valve 208 is functioning properly (e.g., opening and closing as commanded). Thus, the operator may believe that the valve 208 is open when it is actually closed, and closed when it is actually open.

The pumping system 200, and in particular, the piping 204 and valve 208 can be damaged when the valve 208 is incorrectly thought to be open. For example, when the valve 208 does not open when commanded (e.g., a result of a faulty valve 208 or gas valve), the operator may start the pump 202 thinking the valve 208 to be open. The pump 202, therefore, will begin generating pressure to move material through the piping 204 even though the valve 208 is closed. Similarly, the operator may not remember to open the valve 208 before starting the pump 202. Consequently, the material will impact the closed valve 208, which could damage the valve 208. Because the pump 202 will continue to operate, the pressure of the material in the piping 204 can become so great that one or more of the sections of piping 204 burst. Certain embodiments of the present disclosure are accordingly directed to pumping systems having valve control systems that are configured to reduce the risk of the pumping systems becoming damaged as a result of operator error or malfunctioning valves.

Figure 3:
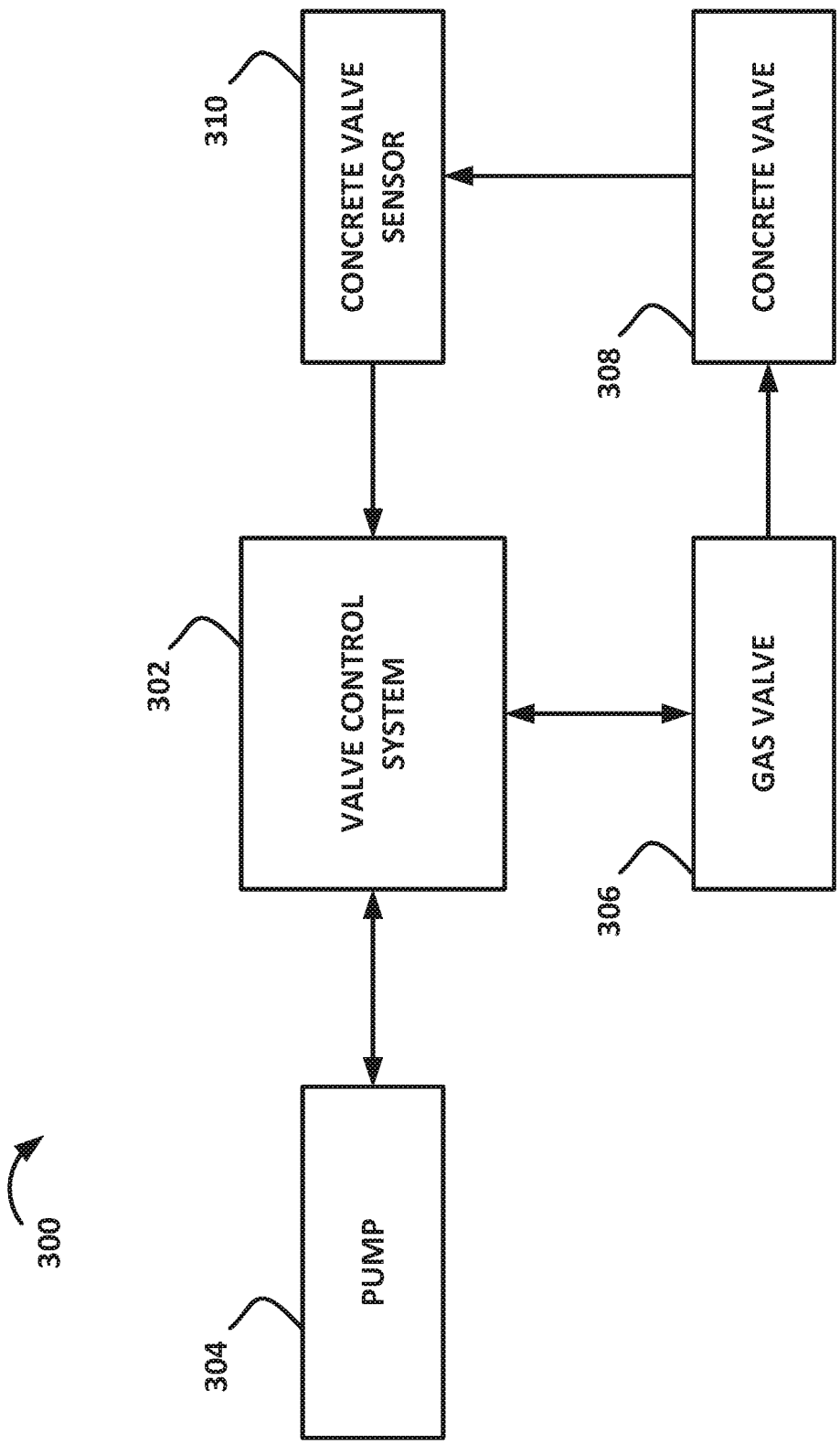
FIG. 3 shows a block representation of a pumping system, in accordance with certain embodiments of the present disclosure.
Figure 4:
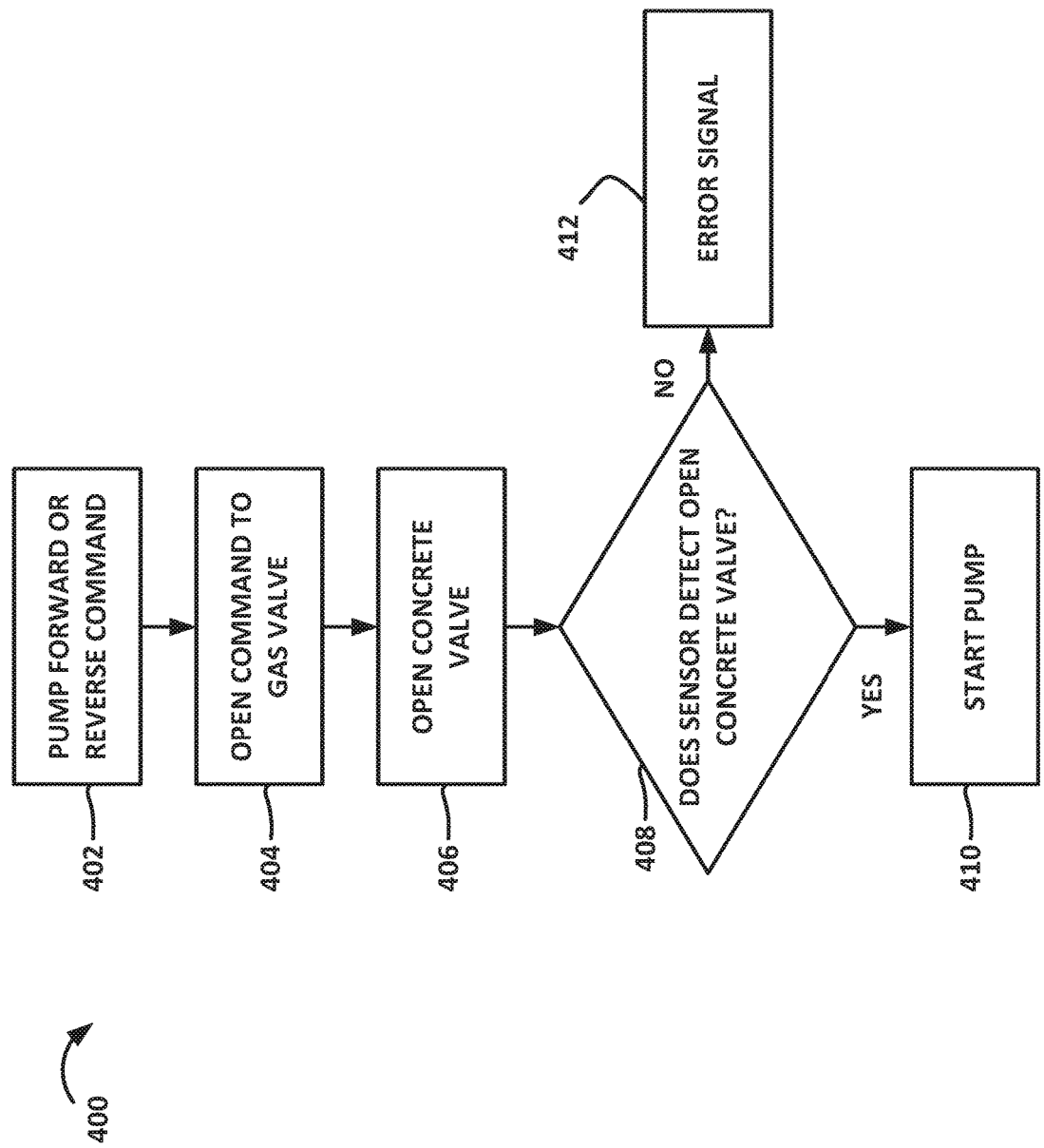
FIG. 4 graphically represents various steps of a routine, in accordance with certain embodiments of the present disclosure.

FIG. 3 shows a block representation of a pumping system 300 including a valve control system 302, a pump 304, a gas valve 306, a concrete valve 308, and a concrete valve sensor 310. FIGS. 4 and 5 show various routines that can be carried out by the valve control system 302. The pumping system 300 can be implemented as the pumping system 200 shown in FIG. 1 to be used in conjunction with the boom system 100 and the truck 300. The pumping system's valve control system 302 is electrically coupled to the pump 304, the gas valve 306, and the concrete valve sensor 310.

The valve control system 302 controls operation of the pump 304 such that the pump 304 will not begin to operate until the valve control system 302 confirms that the concrete valve 308 is open. In use, an operator of the system 300 initiates, via the valve control system 302, a command signal to start (e.g., power) the pump 304. Before the pump 304 starts, the valve control system 302 initiates a routine 400 (shown in FIG. 4) to confirm that the concrete valve 308 is open. Although the pumping system 300 is described as including a concrete valve, the features of the pumping system 300 can be used with materials other than concrete.

The pump 304 can have multiple operating modes including a pump forward mode and a pump reverse mode. Upon initiating a command to begin operating the pump—for example, in either the pump forward or pump reverse mode (step 402)—the valve control system 302 initiates a command to open the concrete valve 308. The valve control system 302 can send a command signal to the gas valve 306 to supply gas (e.g., air) to an actuator (such as actuator 256 in FIG. 2) to open the concrete valve 308 (step 404). In response to the command signal, the gas valve 306 is configured to provide gas (e.g., air) to the concrete valve 308 such that the concrete valve 308 opens (step 406). For example, the gas valve 306 can be coupled to a gas supply and configured to regulate an amount or pressure of gas to and from the concrete valve 308 or to and from an actuator such as the actuator 256 shown in FIG. 2. The gas valve 306 can be fluidly coupled to the concrete valve 308 by a hose through which gas travels to and from the gas valve 306 and concrete valve 308.

The concrete valve 308 is coupled to the concrete valve sensor 310, which detects whether the concrete valve 308 is in an open position or a closed position (step 408). For example, the concrete valve sensor 310 can be a position sensor, among other sensors mentioned above. In embodiments where the concrete valve 308 is a knife valve like the valve 208 shown in FIG. 2, the concrete valve sensor 310 can detect whether the blade 254 and/or actuator 256 is positioned such that the concrete valve 308 is open or closed. Although only one concrete valve sensor 310 is shown in FIG. 3, it is appreciated that more than one concrete valve sensor can be used.

Once the concrete valve sensor 310 confirms that the concrete valve 308 is open, the valve control system 302 sends a command signal to start the pump 304 in either the pump forward or pump reverse mode (step 410), depending on the mode initially selected. If the concrete valve sensor 310 indicates that the concrete valve 308 is not open, the valve control system 302 will not let the pump 304 start and may generate an error signal (step 412). The error signal can be a visual indicator (e.g., light) or audio indicator that warns the operator that the concrete valve 308 may not be functioning properly.

As described above, the valve control system 302 uses an approach that reduces the risk of damage caused to a pumping system by a pump pumping material when a shut-off valve is closed. The routine 400 can be initiated upon a request or command to start the pump 304 and automatically run through the various steps without requiring additional commands or input from an operator of the pumping system 300. The routine 400 can run quickly such that there is little delay between an operator attempting to start the pump 304 and the pump 304 either starting after the valve control system 302 confirms that the concrete valve 308 is open or indicating, via an error signal, that a component of the pumping system 300 has malfunctioned.

FIG. 5 shows another routine 500 that can be carried out by the valve control system 302. The routine 500 is initiated when an operator of the system 300 initiates, via the valve control system 302, a command to stop (e.g., power off) the pump 304. Upon initiating a command to stop pump operation, the valve control system 302 initiates a command to stop the pump 304 (step 502). If the concrete valve 308 is a hydraulic valve, the valve control system 302 can send a command signal to the gas valve 306 to close the concrete valve 308 (step 504). In response to the command signal, the gas valve 306 is configured to provide gas to the concrete valve 308 such that the concrete valve 308 closes (step 506). If the concrete valve sensor 310 cannot confirm that the concrete valve 308 is closed, the valve control system 302 generates an error signal (step 510). If the concrete valve sensor 310 confirms that the concrete valve 308 is closed, the valve control system 302 continues to operate normally (step 512).

The various embodiments and components described above, including aspects of the valve control system 302, may be implemented using firmware, integrated circuits, and/or software modules that interact with each other or are combined together. For example, the control diagrams and routines illustrated herein may be used to create computer-readable instructions/code for execution by a processor such as a microprocessor. Such instructions may be stored on a non-transitory computer-readable medium and transferred to a processor for execution. The structures and procedures shown above are only a representative example of embodiments that can be used to provide the functions described hereinabove.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

What is claimed is:

1. A method for use with a pumping system, the method comprising:
receiving a pump command signal for starting a pump;
initiating a valve command signal for opening a valve, in response to the receiving the pump command signal;
receiving a first valve sensor signal, from a sensor coupled to the valve, indicating that the valve is open;

initiating a pump start command signal, in response to the received first valve sensor signal indicating that the valve is open;
initiating a pump stop command;
receiving a pump signal indicating that the pump has stopped;
sending a close valve signal to close the valve;
receiving a second valve sensor signal indicating that the valve is not closed; and
generating an error signal in response to the second valve sensor signal.

2. The method of claim 1, wherein the pump command signal is configured to initiate a pump forward pumping operation.

3. The method of claim 1, wherein the pump command signal is configured to initiate a pump reverse pumping operation.

4. The method of claim 1, further comprising:
opening the valve, in response to the valve command signal; and
powering the pump, in response to the pump start command signal.

5. The method of claim 4, further comprising:
pumping a material, via the powered pump, through the valve.

6. The method of claim 1, wherein the valve is a hydraulic valve and wherein the valve is coupled to a gas valve, the method further comprising:
regulating flow of gas between the gas valve and the valve, in response to the valve command signal.

7. The method of claim 1, wherein the error signal is either a visual or an audio indicator.

8. A pumping system comprising:
control circuitry configured to:
receive a pump command signal for starting a pump;
initiate a valve command signal for opening a valve, in response to the pump command signal;
receive a first valve sensor signal, from a sensor coupled to the valve, indicating that the valve is either open or closed;
initiate a pump start command signal for starting the pump, in response to the received first valve sensor signal indicating that the valve is open; and
generate an error signal, in response to the received first valve sensor signal indicating that the valve is closed.

9. The pumping system of claim 8, further comprising:
the pump fluidly coupled to the valve.

10. The pumping system of claim 9, further comprising:
the sensor, which is configured to generate the valve sensor signal.

11. The pumping system of claim 9, wherein the valve includes an actuator, the pumping system further comprising:
a gas valve coupled to the actuator and configured to actuate the valve into either an open or closed position.

12. The pumping system of claim 9, further comprising:
a boom truck comprising:
a frame;
a boom system coupled to the frame, wherein the boom system includes a plurality of boom sections; and
a material pumping system coupled to the frame, wherein the material pumping system includes:
the pump,
a plurality of pipes, each pipe coupled to at least one of the plurality of boom sections and each pipe coupled to at least one other pipe to form a pumping conduit,
the valve coupled to the pumping conduit, and
a sensor coupled to the valve and configured to generate the first valve sensor signal.

13. The pumping system of claim 12 wherein the valve is either a knife valve or a clamp valve.

14. The pumping system of claim 12, wherein the sensor is a position sensor.

15. The pumping system of claim 12, wherein the material pumping system further includes a hose fluidly coupled to the plurality of pipes.

16. The pumping system of claim 9, wherein the control circuitry is further configured to:
initiate a pump stop command;
receive a second valve sensor signal indicating that the valve is not closed; and
generate an error signal in response to the second valve sensor signal.

17. The pumping system of claim 9, wherein the error signal is either a visual or an audio indicator.

* * * * *